US011165341B2

(12) United States Patent
Yazaki et al.

(10) Patent No.: US 11,165,341 B2
(45) Date of Patent: Nov. 2, 2021

(54) NOISE REDUCTION CIRCUIT AND NOISE REDUCTION ELEMENT

(71) Applicant: Murata Manufacturing Co., Ltd., Nagaokakyo (JP)

(72) Inventors: Hirokazu Yazaki, Nagaokakyo (JP); Takanori Tsuchiya, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 139 days.

(21) Appl. No.: 16/446,695

(22) Filed: Jun. 20, 2019

(65) Prior Publication Data

US 2019/0305673 A1 Oct. 3, 2019

Related U.S. Application Data

(63) Continuation of application No. PCT/JP2018/018387, filed on May 11, 2018.

(30) Foreign Application Priority Data

Jun. 19, 2017 (JP) .............................. JP2017-119497
Feb. 9, 2018 (JP) .............................. JP2018-022076

(51) Int. Cl.
*H02M 1/44* (2007.01)
*H01F 27/40* (2006.01)
(Continued)

(52) U.S. Cl.
CPC .............. *H02M 1/44* (2013.01); *H01F 27/40* (2013.01); *H01G 4/40* (2013.01); *H02M 3/155* (2013.01);
(Continued)

(58) Field of Classification Search
CPC .......... H02M 1/44; H02M 3/04; H02M 3/155; H01F 27/40; H01F 17/0013; H01G 4/38;
(Continued)

(56) References Cited

U.S. PATENT DOCUMENTS

2009/0201005 A1   8/2009  Noma et al.
2013/0049730 A1   2/2013  Kato
(Continued)

FOREIGN PATENT DOCUMENTS

JP    2007194474 A  *  8/2007
JP    2009-177998 A    8/2009
(Continued)

OTHER PUBLICATIONS

Official Communication issued in International Patent Application No. PCT/JP2018/018387, dated Jul. 10, 2018.

Primary Examiner — Thienvu V Tran
Assistant Examiner — Sreeya Sreevatsa
(74) Attorney, Agent, or Firm — Keating & Bennett, LLP

(57) ABSTRACT

A noise reduction circuit is connected between at least one line of an input line and an output line of a DC-DC converter, a ground, and a ground terminal of a switching control IC included in the DC-DC converter. The noise reduction circuit includes a first capacitor connected between the at least one line and the ground terminal, a second capacitor connected between the at least one line and the ground, and an inductor connected between the ground terminal and the ground.

16 Claims, 17 Drawing Sheets

(51) Int. Cl.
*H01G 4/40* (2006.01)
*H02M 3/155* (2006.01)
*H02M 3/04* (2006.01)
*H01L 23/64* (2006.01)
*H01G 4/38* (2006.01)
*H01F 17/00* (2006.01)
*H01L 23/66* (2006.01)

(52) U.S. Cl.
CPC ............ *H01F 17/0013* (2013.01); *H01G 4/38* (2013.01); *H01L 23/645* (2013.01); *H01L 23/647* (2013.01); *H01L 23/66* (2013.01); *H02M 3/04* (2013.01)

(58) Field of Classification Search
CPC ......... H01G 4/40; H01L 23/66; H01L 23/645; H01L 23/647
USPC ........................................................ 361/270
See application file for complete search history.

(56) References Cited

U.S. PATENT DOCUMENTS

2013/0187480 A1  7/2013  Hiei
2019/0165666 A1* 5/2019  Nishimoto .......... H02M 3/1582

FOREIGN PATENT DOCUMENTS

| JP | 4325747 B2 | 9/2009 |
| JP | 2013-046509 A | 3/2013 |
| JP | 2014-124091 A | 7/2014 |
| JP | 2015-216825 A | 12/2015 |
| JP | 2016-129489 A | 7/2016 |
| WO | 2012/101858 A1 | 8/2012 |

* cited by examiner

NOISE REDUCTION CIRCUIT AND NOISE REDUCTION ELEMENT

CROSS REFERENCE TO RELATED APPLICATIONS

This application claims the benefit of priority to Japanese Patent Application No. 2017-119497 filed on Jun. 19, 2017 and Japanese Patent Application No. 2018-022076 filed on Feb. 9, 2018, and is a Continuation Application of PCT Application No. PCT/JP2018/018387 filed on May 11, 2018. The entire contents of each application are hereby incorporated herein by reference.

BACKGROUND OF THE INVENTION

1. Field of the Invention

The present invention relates to a noise reduction circuit and a noise reduction element, and particularly, to a noise reduction circuit and a noise reduction element connected between at least one line of an input line and an output line of a DC-DC converter, a ground, and a ground terminal of a switching control IC.

2. Description of the Related Art

DC-DC converters are known which include a switching element and an inductor, raise or lower an input voltage, and output the resulting voltage.

For example, FIG. 6 in Japanese Patent No. 4325747 illustrates a DC-DC converter module that is configured to reduce noise by placing an inductor in series between a smoothing capacitor in an output line and a ground.

The DC-DC converter module described in Japanese Patent No. 4325747 has a problem in that although a pulse current in a high frequency band is able to be reduced by the inductor placed in series between the smoothing capacitor and the ground, noise in a low frequency band, such as a ripple voltage, may not be fully reduced depending on the value of the inductor.

SUMMARY OF THE INVENTION

Preferred embodiments of the present invention provide noise reduction circuits and noise reduction elements that are each capable of effectively reducing noise in a low frequency band as well as noise in a high frequency band.

A noise reduction circuit according to a preferred embodiment of the present invention is connected between at least one line of an input line and an output line of a DC-DC converter, a ground, and a ground terminal of a switching control IC included in the DC-DC converter. The noise reduction circuit includes a first capacitor connected between the at least one line and the ground terminal, a second capacitor connected between the at least one line and the ground, and a first inductor connected between the ground terminal and the ground.

A capacitance of the second capacitor may be larger than or equal to a capacitance of the first capacitor.

The first capacitor may be connected between the output line and the ground terminal, and the second capacitor may be connected between the output line and the ground. The noise reduction circuit may further include a third capacitor connected between the input line and the ground terminal, and a fourth capacitor connected between the input line and the ground.

A capacitance of the fourth capacitor may be larger than or equal to a capacitance of the third capacitor.

The first inductor may include an input-side inductor and an output-side inductor. The input-side inductor may be connected to the ground, with an input-side ground line interposed therebetween, and the output-side inductor may be connected to the ground, with an output-side ground line interposed therebetween.

The noise reduction circuit may further include a second inductor connected between the at least one line and the first capacitor.

A noise reduction element according to a preferred embodiment of the present invention is connected between at least one line of an input line and an output line of a DC-DC converter, a ground, and a ground terminal of a switching control IC included in the DC-DC converter. The noise reduction element includes a ferrite multilayer substrate; a first capacitor mounted on the ferrite multilayer substrate, connected at one end thereof to the at least one line, and connected at the other end thereof to the ground terminal; a first inductor defined by an internal wire inside the ferrite multilayer substrate, connected at one end thereof to the first capacitor, and connected at the other end thereof to a second capacitor different from the first capacitor; and a surface wire disposed on a surface of the ferrite multilayer substrate and configured to make connection between the first capacitor and the ground terminal.

The second capacitor may be mounted on the ferrite multilayer substrate, connected at one end thereof to the at least one line, and connected at the other end thereof to the ground.

A capacitance of the second capacitor may be larger than or equal to a capacitance of the first capacitor.

In the noise reduction element, the one end of the first capacitor may be connected to the output line, and one end of the second capacitor may be connected to the output line. The noise reduction element may further include a third capacitor mounted on the ferrite multilayer substrate, connected at one end thereof to the input line, and connected at the other end thereof to the ground terminal; and a fourth capacitor mounted on the ferrite multilayer substrate, connected at one end thereof to the input line, and connected at the other end thereof to the ground.

In the noise reduction element, a capacitance of the fourth capacitor may be larger than or equal to a capacitance of the third capacitor.

In the noise reduction element, the first inductor may include an input-side inductor and an output-side inductor; and the surface wire may include an input-side ground surface wire to connect the input-side inductor to the ground, and an output-side ground surface wire to connect the output-side inductor to the ground.

The noise reduction element may further include a second inductor defined by an internal wire inside the ferrite multilayer substrate, connected at one end thereof to the at least one line, and connected at the other end thereof to the first capacitor.

The ferrite multilayer substrate may include non-magnetic layers and a magnetic layer having a higher magnetic permeability than the non-magnetic layers, and the first inductor and the second inductor may be disposed on the magnetic layer.

The non-magnetic layers may sandwich the magnetic layer therebetween.

In noise reduction circuits according to preferred embodiments of the present invention, a pulse current in a high frequency band is reduced by passing along the line including the first capacitor and the first inductor, and noise in a low frequency band is reduced by passing through the second capacitor. Thus, noise in the high frequency band and noise in the low frequency band are both effectively reduced.

In noise reduction elements according to preferred embodiments of the present invention, a pulse current in a high frequency band is reduced by passing through the first capacitor and the internal wire defining and functioning as the first inductor, and a noise in a low frequency band is reduced by passing through the second capacitor. Thus, noise in the high frequency band and noise in the low frequency band are both effectively reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Features of the present invention will now be described in detail with reference to preferred embodiments of the present invention and the drawings.

A circuit of a DC-DC converter is described first, and this is followed by a description of a noise reduction circuit according to preferred embodiments of the present invention.

Figure 1:
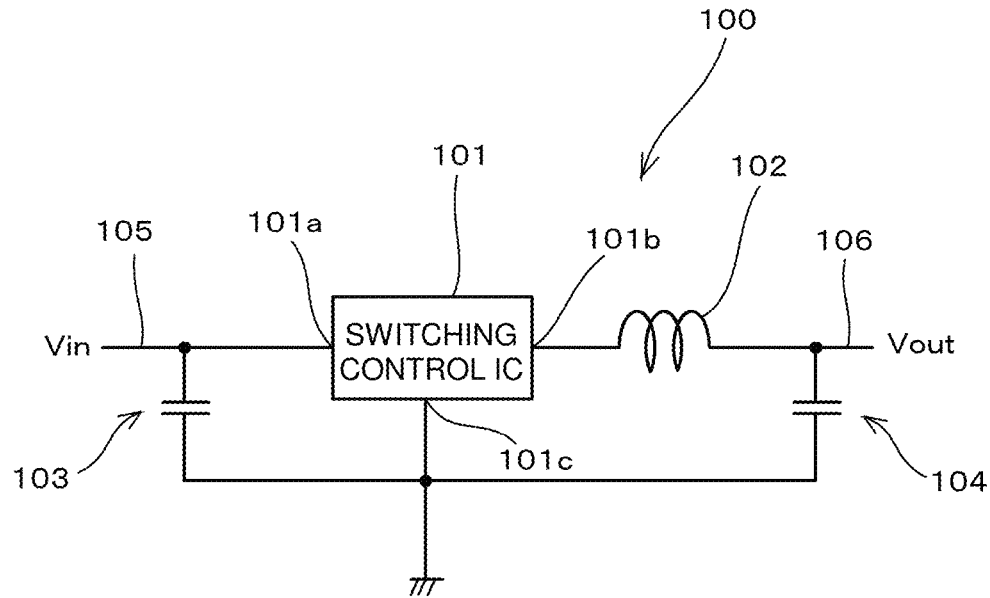
FIG. 1 is a diagram illustrating an exemplary circuit of a step-down DC-DC converter.

FIG. 1 is a diagram illustrating an exemplary circuit of a step-down DC-DC converter 100. The DC-DC converter 100 includes a switching control IC 101, a main inductor 102, an input-side capacitor 103, and an output-side capacitor 104. The DC-DC converter 100 is a non-insulated DC-DC converter.

The switching control IC 101 includes at least a switching element and a control circuit that controls the on and off of the switching element. The switching control IC 101 may have other functions, such as communication control functions.

An input terminal 101a of the switching control IC 101 is connected to an input line 105. The input-side capacitor 103 is disposed between the input line 105 and a ground.

One end of the main inductor 102 is connected to an output terminal 101b of the switching control IC 101, and the other end of the main inductor 102 is connected to an output line 106. The output-side capacitor 104 is disposed between the output line 106 and the ground.

A ground terminal 101c of the switching control IC 101 is connected to the ground (ground potential) defining and functioning as a reference potential.

Under switching control by the switching control IC 101, the DC-DC converter 100 configured as described above lowers an input voltage Vin input to the input line 105 and outputs an output voltage Vout from the output line 106.

At the same time, the DC-DC converter performs switching using the switching element. This produces noise in a low frequency band depending on the switching frequency, and also produces a pulse current in a high frequency band higher than the switching frequency.

First Preferred Embodiment

Figure 2:
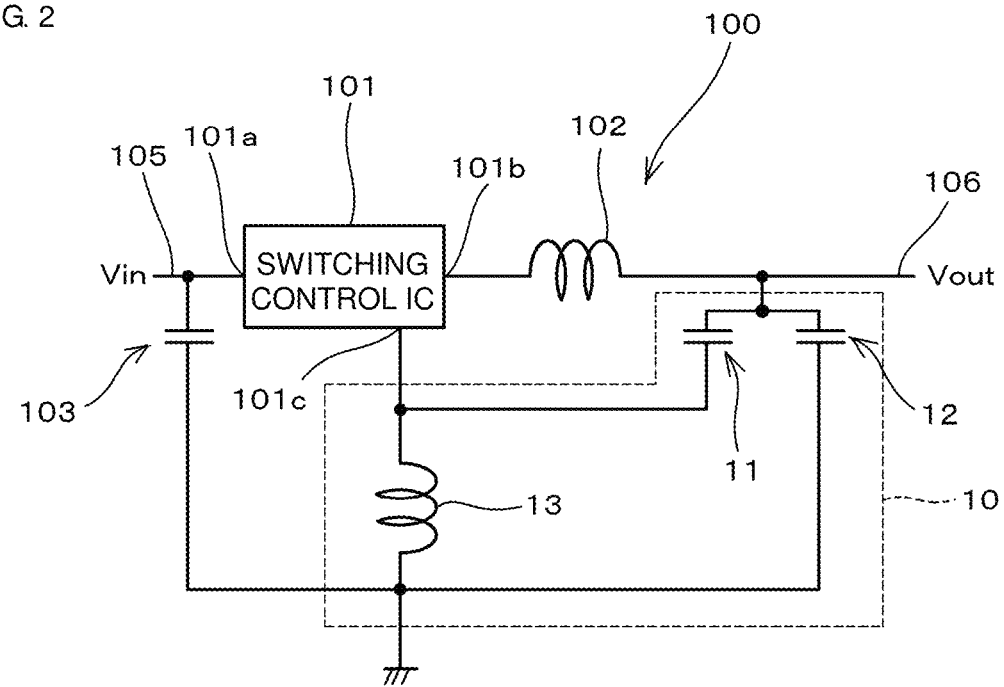
FIG. 2 is a diagram illustrating a noise reduction circuit according to a first preferred embodiment of the present invention.

FIG. 2 is a diagram illustrating a noise reduction circuit according to a first preferred embodiment of the present invention. The same portions as those of the circuit of the DC-DC converter illustrated in FIG. 1 are denoted by the same reference numerals, and will not be described in detail here.

A noise reduction circuit 10 according to the first preferred embodiment includes a first capacitor 11, a second capacitor 12, and an inductor (first inductor) 13. The noise reduction circuit 10 is connected between the output line 106 of the DC-DC converter 100, the ground, and the ground terminal 101c of the switching control IC 101.

The first capacitor 11 is connected between the output line 106 and the ground terminal 101c of the switching control IC 101.

The second capacitor 12 is connected between the output line 106 and the ground. The second capacitor 12 corresponds to the output-side capacitor 104 illustrated in FIG. 1. That is, the second capacitor 12 is also an output-side capacitor of the DC-DC converter 100.

In the present preferred embodiment, the capacitance of the second capacitor 12 is preferably larger than the capacitance of the first capacitor 11. The capacitance of the second capacitor may preferably be equal or substantially equal to the capacitance of the first capacitor 11.

The inductor 13 is connected between the ground terminal 101c of the switching control IC 101 and the ground.

With the configuration described above, a pulse current in a high frequency band flowing in the output line 106 is allowed to flow toward the first capacitor 11 and the inductor 13 and is reduced. Also, noise in a low frequency band passing along the output line 106 is passed through the second capacitor 12 and is reduced.

In particular, since making the capacitance of the second capacitor 12 larger than the capacitance of the first capacitor 11 lowers the impedance of the second capacitor 12, noise in the low frequency band is allowed to flow toward the second capacitor 12 and is effectively reduced. Even when the capacitance of the second capacitor 12 is equal or substantially equal to the capacitance of the first capacitor 11, connecting the inductor 13 in series to the first capacitor 11 increases the impedance and enables similar advantageous effects to be achieved.

That is, the noise reduction circuit 10 according to the present preferred embodiment effectively reduces noise in the low frequency band as well as noise in the high frequency band. The output voltage Vout is thus able to be output from the output line 106, with reduced noise in the high and low frequency bands.

Figure 3:
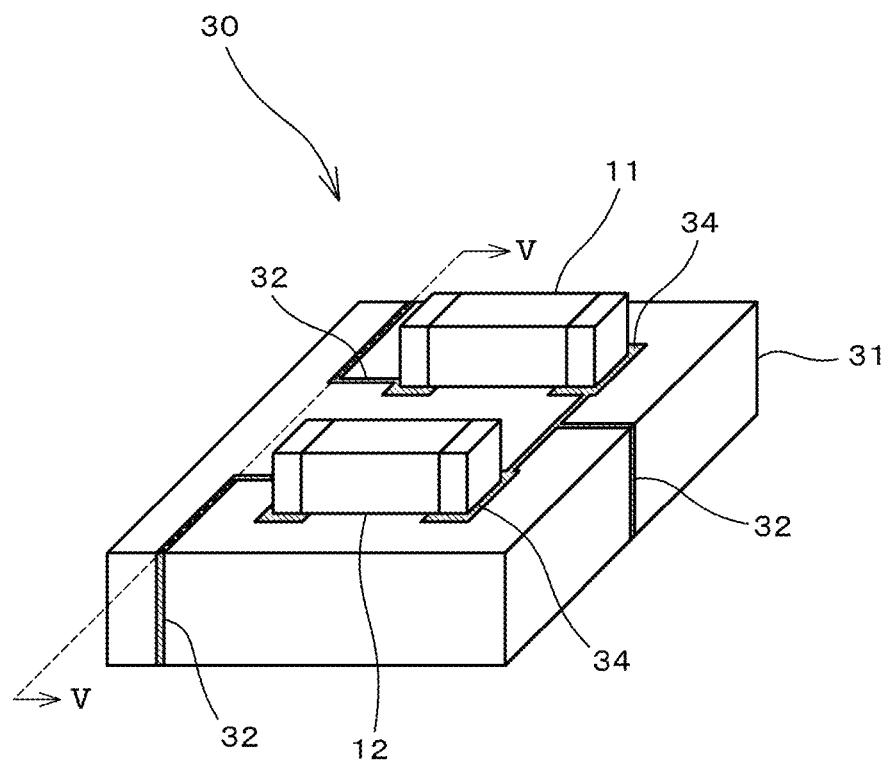
FIG. 3 is a perspective view illustrating an exterior of a noise reduction element that embodies the noise reduction circuit according to the first preferred embodiment of the present invention.
Figure 4:
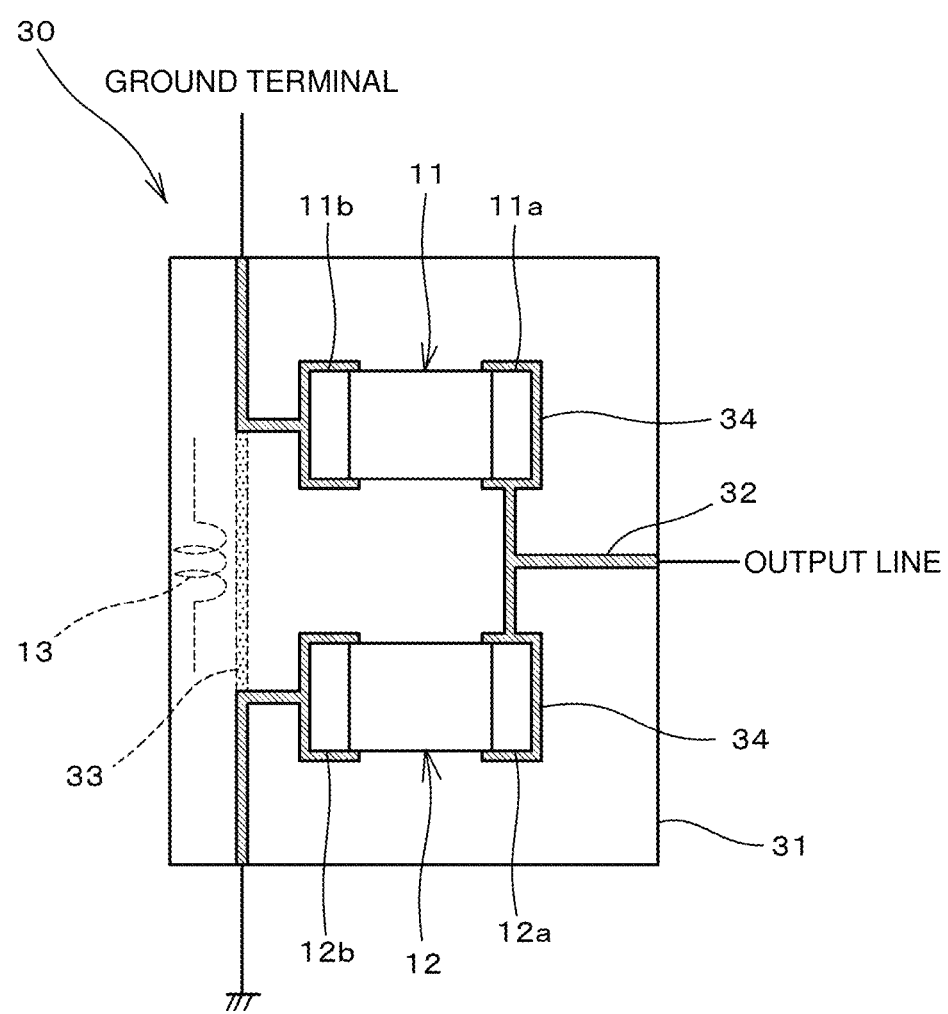
FIG. 4 is a plan view of the noise reduction element illustrated in FIG. 3.
Figure 5A:
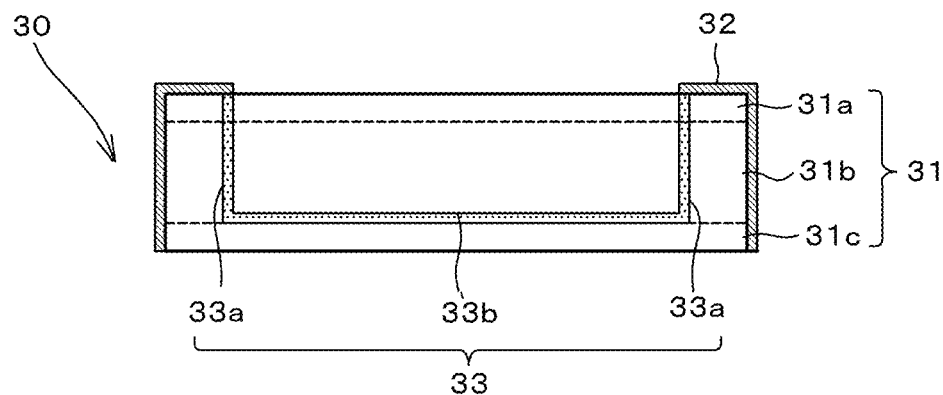
FIG. 5A is a cross-sectional view of the noise reduction element illustrated in FIG. 3 taken along line V-V.
Figure 5B:
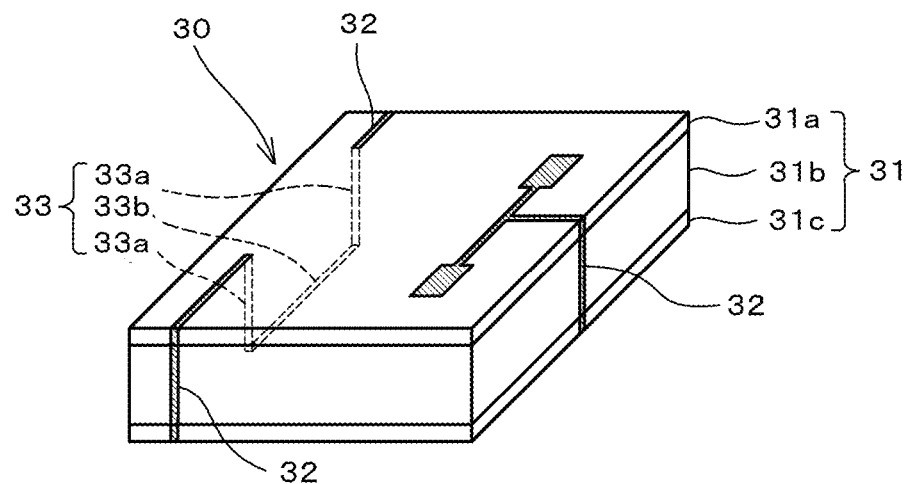
FIG. 5B is a perspective view illustrating how an internal wire is positioned.
Figure 5C:
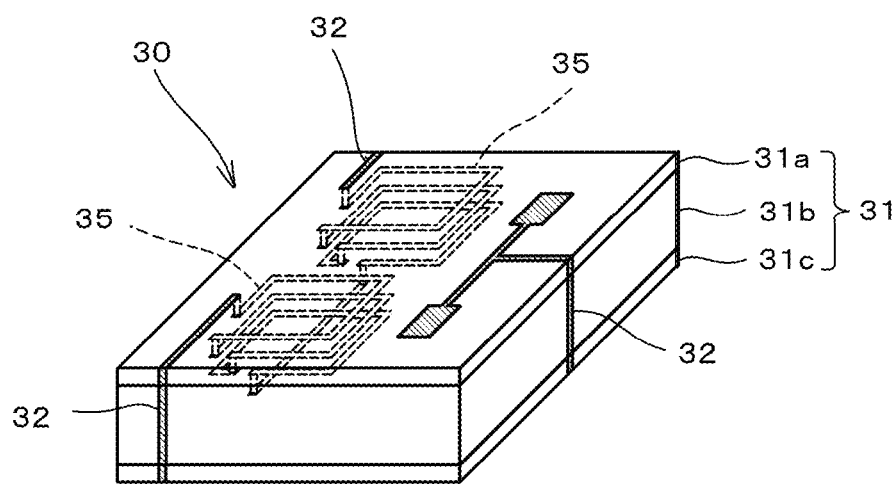
FIG. 5C is a perspective view of the noise reduction element that includes coils, instead of via hole conductors.

FIG. 3 is a perspective view illustrating an exterior of a noise reduction element 30 that embodies the noise reduction circuit according to the first preferred embodiment. FIG. 4 is a plan view of the noise reduction element 30 illustrated in FIG. 3. FIG. 5A is a cross-sectional view of the noise reduction element illustrated in FIG. 3 taken along line V-V, FIG. 5B is a perspective view illustrating how an internal wire is positioned, and FIG. 5C is a perspective view of the noise reduction element 30 that includes coils, instead of via hole conductors. Note that a portion of a surface wire 32, and some of land electrodes 34, the first capacitor 11, and the second capacitor 12 are not shown in FIGS. 5B and 5C.

The noise reduction element 30 includes a ferrite multilayer substrate 31, the first capacitor 11 mounted on the ferrite multilayer substrate 31, the second capacitor 12 mounted on the ferrite multilayer substrate 31, an internal wire 33 disposed inside the ferrite multilayer substrate 31 and defining and functioning as an inductor, the surface wire 32 disposed on the surface of the ferrite multilayer substrate 31, and the land electrodes 34 disposed on the surface of the ferrite multilayer substrate 31.

The first capacitor 11 is mounted such that outer electrodes 11a and 11b defining a pair are positioned on the respective land electrodes 34. The second capacitor 12 is mounted such that outer electrodes 12a and 12b defining a pair are positioned on the respective land electrodes 34.

As illustrated in FIGS. 5A and 5B, the ferrite multilayer substrate 31 has a structure in which a first non-magnetic layer 31a, a magnetic layer 31b, and a second non-magnetic layer 31c are stacked in order. That is, the first non-magnetic layer 31a, the magnetic layer 31b, and the second non-magnetic layer 31c are disposed such that the magnetic layer 31b having a higher magnetic permeability than the first non-magnetic layer 31a and the second non-magnetic layer 31c is sandwiched between the non-magnetic layers 31a and 31c. The first non-magnetic layer 31a, the magnetic layer 31b, and the second non-magnetic layer 31c each have a structure in which a plurality of ceramic insulating layers are stacked.

As illustrated in FIG. 4, the noise reduction element 30 is connected between the output line of the DC-DC converter, the ground, and the ground terminal of the switching control IC.

The outer electrode 11a disposed at one end of the first capacitor 11 is connected to the output line of the DC-DC converter, with the surface wire 32 interposed therebetween, and the outer electrode 11b disposed at the other end of the first capacitor 11 is connected to the ground terminal of the switching control IC, with the surface wire 32 interposed therebetween.

The outer electrode 12a disposed at one end of the second capacitor 12 is connected to the output line of the DC-DC converter, with the surface wire 32 interposed therebetween, and the outer electrode 12b disposed at the other end of the second capacitor 12 is connected to the ground, with the surface wire 32 interposed therebetween.

The internal wire 33 is connected at one end thereof to the first capacitor 11, with the surface wire 32 interposed therebetween, and connected at the other end thereof to the second capacitor 12, with the surface wire 32 interposed therebetween. More specifically, the one end of the internal wire 33 is connected to the outer electrode 11b of the first capacitor 11, with the surface wire 32 interposed therebetween. Also, the other end of the internal wire 33 is connected to the outer electrode 12b of the second capacitor 12, with the surface wire 32 interposed therebetween.

As illustrated in FIGS. 5A and 5B, the internal wire 33 includes a wire 33b disposed along the interface between the magnetic layer 31b and the second non-magnetic layer 31c, and via hole conductors 33a passing through the first non-magnetic layer 31a and the magnetic layer 31b. The via hole conductors 33a connect the surface wire 32 on the surface of the ferrite multilayer substrate 31 to the wire 33b. Of the via hole conductors 33a and the wire 33b, mainly the via hole conductors 33a define and function as the inductor 13.

As illustrated in FIG. 5C, coils 35 having winding axes in the stacking direction may replace the via hole conductors 33a and define and function as the inductor 13.

As illustrated in FIGS. 3 and 4, the surface wire 32 makes connection between the first capacitor 11 and the ground terminal of the switching control IC, between the output line of the DC-DC converter and the first capacitor 11 and the second capacitor 12, and between the second capacitor 12 and the ground. By making these connections using the surface wire 32, unintended formation of an inductor is prevented.

Figure 6A:
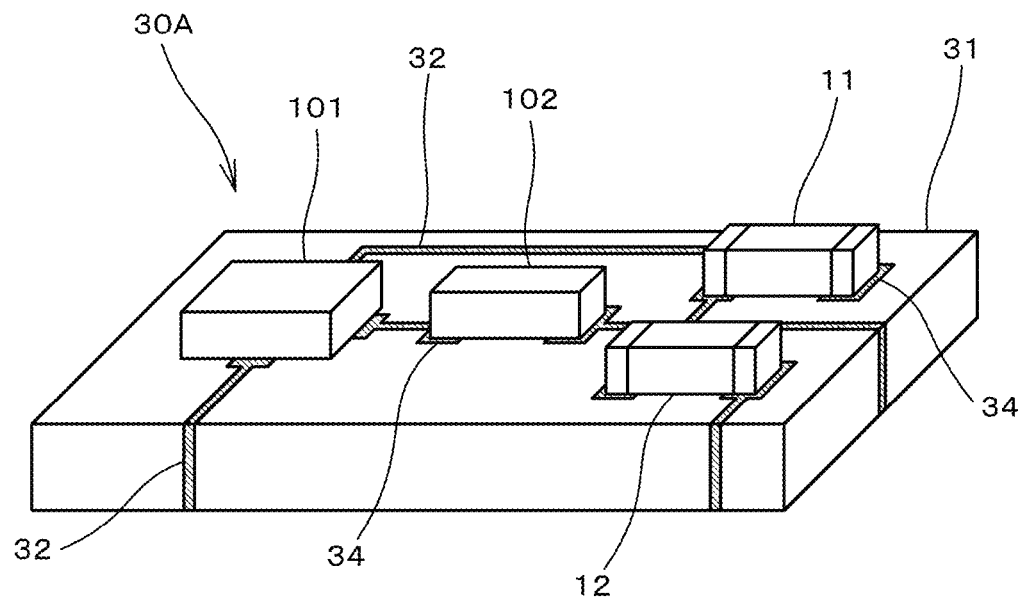
FIG. 6A is a perspective view illustrating another example of a configuration of the noise reduction element according to the first preferred embodiment of the present invention.
Figure 6B:
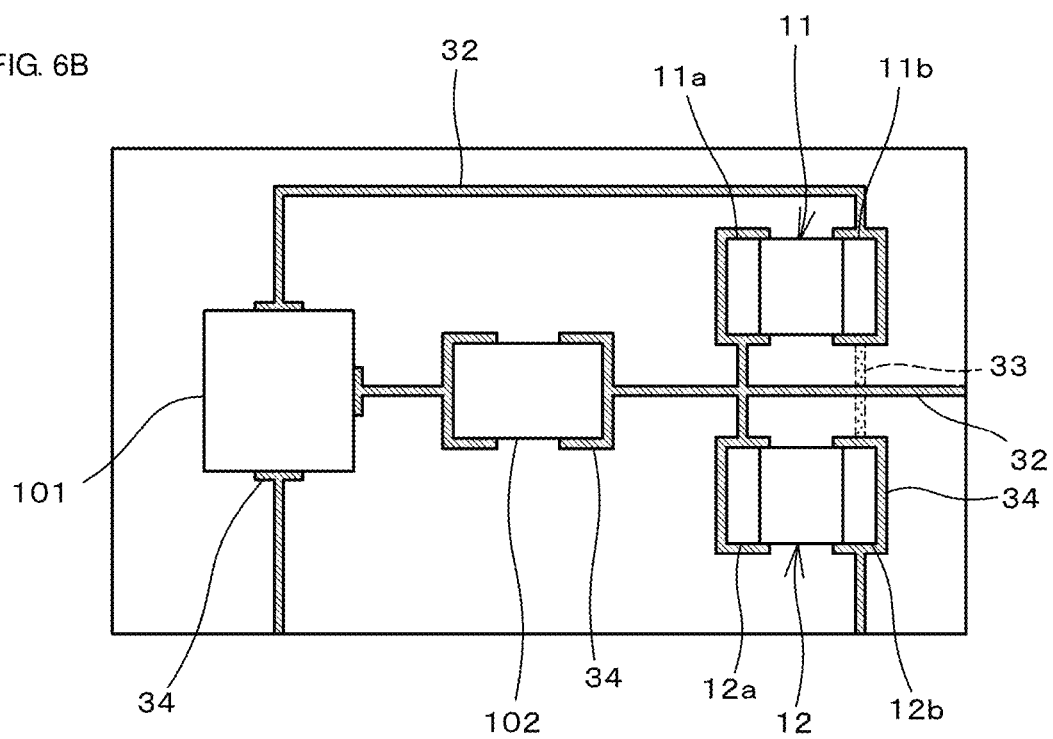
FIG. 6B is a plan view of the same.

FIG. 6A is a perspective view illustrating another example of a configuration of the noise reduction element according to the first preferred embodiment, and FIG. 6B is a plan view of the same. A noise reduction element 30A illustrated in FIGS. 6A and 6B differs from the noise reduction element 30 in FIG. 3 in that it further includes the switching control IC 101 and the main inductor 102 mounted on the ferrite multilayer substrate 31.

In the noise reduction element 30A illustrated in FIGS. 6A and 6B, the surface wire 32 makes connection between the outer electrode 11b of the first capacitor 11 and the ground terminal of the switching control IC 101, between the output line of the DC-DC converter and the outer electrode 11a of the first capacitor 11 and the outer electrode 12a of the second capacitor 12, between the outer electrode 12b of the second capacitor 12 and the ground, between the switching control IC 101 and the input line 105 (see FIG. 2), and between the switching control IC 101 and the main inductor 102 (see FIG. 2).

The internal wire 33 is connected at one end thereof to the outer electrode 11b of the first capacitor 11, with the land electrode 34 interposed therebetween, and is connected at the other end thereof to the outer electrode 12b of the second capacitor 12, with the land electrode 34 interposed therebetween (see FIG. 4, FIGS. 5A and 5B).

Figure 7A:
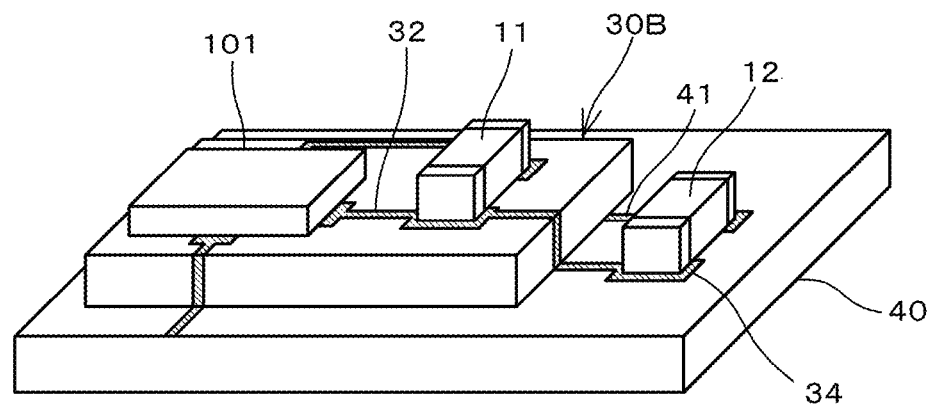
FIG. 7A is a perspective view illustrating another example of a configuration of the noise reduction element according to the first preferred embodiment of the present invention.
Figure 7B:
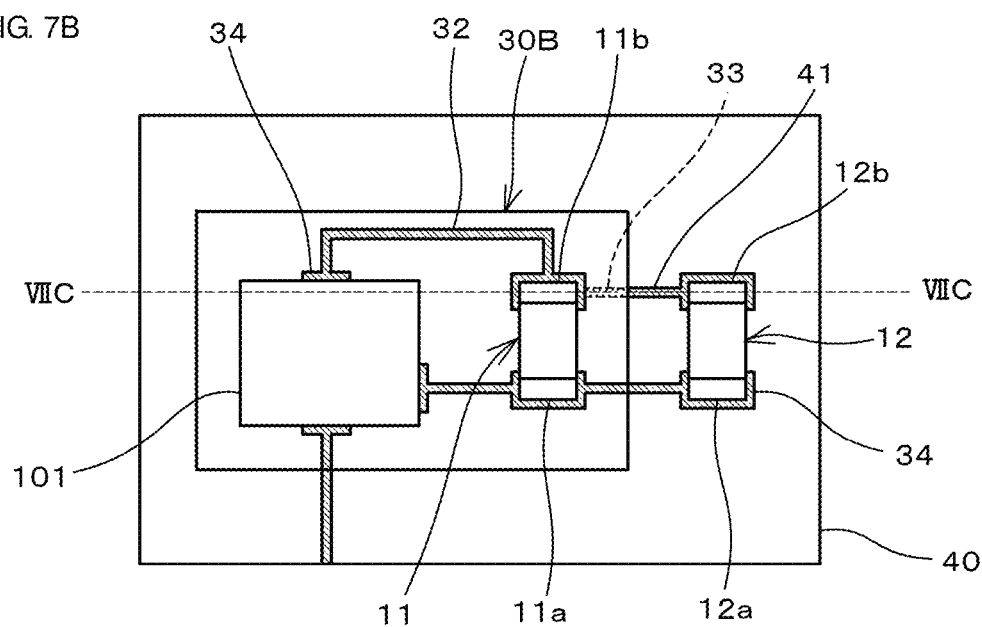
FIG. 7B is a plan view of the same.
Figure 7C:
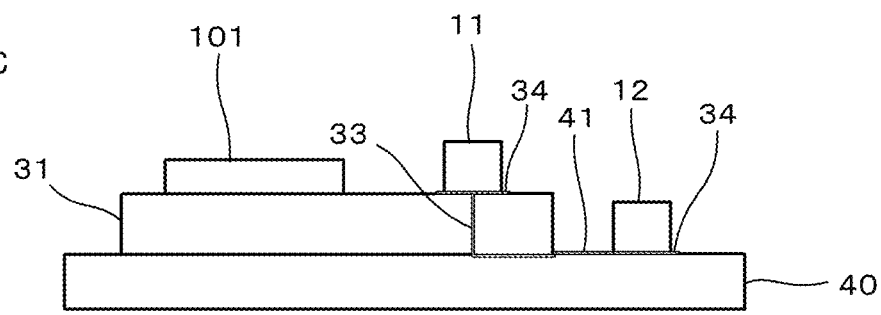
FIG. 7C is a cross-sectional view taken along line VIIC-VIIC in FIG. 7B.

FIG. 7A is a perspective view illustrating another example of a configuration the noise reduction element according to the first preferred embodiment, and FIG. 7B is a plan view of the same. FIG. 7C is a cross-sectional view taken along line VIIC-VIIC in FIG. 7B. Note that a portion of the surface wire and the main inductor 102 are not shown in FIGS. 7A to 7C.

A noise reduction element 30B illustrated in FIGS. 7A to 7C differs from the noise reduction element 30A in FIGS. 6A and 6B in that the second capacitor 12 is not disposed on the ferrite multilayer substrate 31, but instead, is disposed on a motherboard 40 including the ferrite multilayer substrate 31 mounted thereon.

The connection between the first capacitor 11 and the switching control IC 101 and the connection between the first capacitor 11 and the second capacitor 12 are the same or substantially the same as those in the noise reduction element 30A illustrated in FIGS. 6A and 6B. Note, however, that since the second capacitor 12 is mounted on the motherboard 40, not on the ferrite multilayer substrate 31, the connection between the outer electrode 11b of the first capacitor 11 and the outer electrode 12b of the second capacitor 12 is made, as illustrated in FIG. 7B, by the internal wire 33 defining and functioning as an inductor and a surface wire 41 disposed on the motherboard 40.

Second Preferred Embodiment

Figure 8:
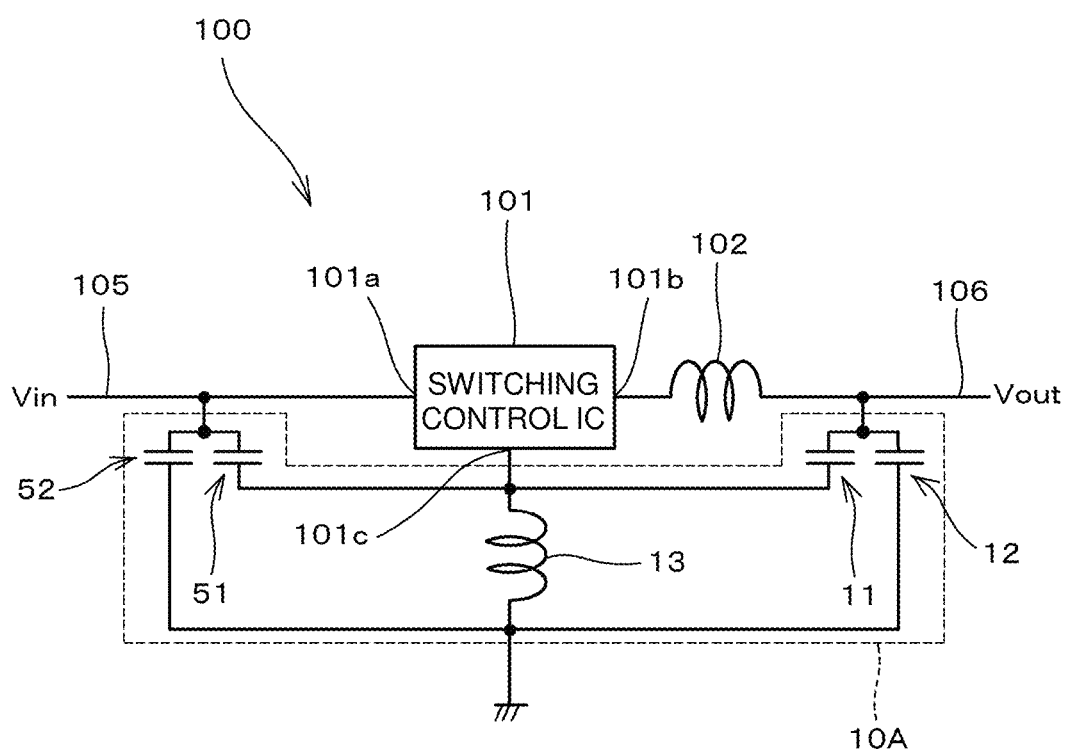
FIG. 8 is a diagram illustrating a noise reduction circuit according to a second preferred embodiment of the present invention.

FIG. 8 is a diagram illustrating a noise reduction circuit according to a second preferred embodiment of the present invention. The same or similar portions as those of the noise reduction circuit illustrated in FIG. 2 are denoted by the same reference numerals, and will not be described in detail here.

The noise reduction circuit 10 according to the first preferred embodiment is configured to reduce noise on the output side of the DC-DC converter 100. A noise reduction circuit 10A according to the second preferred embodiment effectively reduces noise on both of the input side and the output side of the DC-DC converter 100.

The noise reduction circuit 10A according to the second preferred embodiment includes a third capacitor 51 and a fourth capacitor 52, in addition to the components of the noise reduction circuit 10 according to the first preferred embodiment.

The third capacitor 51 is connected between the input line 105 and the ground terminal 101c of the switching control IC 101.

The fourth capacitor 52 is connected between the input line 105 and the ground. The fourth capacitor 52 corresponds to the input-side capacitor 103 illustrated in FIG. 1. In other words, the fourth capacitor 52 is also an input-side capacitor of the DC-DC converter 100.

In the present preferred embodiment, the capacitance of the fourth capacitor 52 is preferably larger than the capacitance of the third capacitor 51. The capacitance of the fourth capacitor 52 may be equal or substantially equal to the capacitance of the third capacitor 51.

The configuration described above reduces noise in the high and low frequency bands, not only on the output side, but also on the input side. That is, noise in the high frequency band on the input line 105 is allowed to flow toward the third capacitor and the inductor 13 and is reduced, and noise in the low frequency band is allowed to flow toward the fourth capacitor 52 and is reduced.

In particular, since making the capacitance of the fourth capacitor 52 larger than the capacitance of the third capacitor 51 lowers the impedance of the fourth capacitor 52, noise in the low frequency band is allowed to flow toward the fourth capacitor 52 and is effectively reduced. Even when the capacitance of the fourth capacitor 52 is equal or substantially equal to the capacitance of the third capacitor 51, connecting the inductor 13 in series to the third capacitor 51 increases the impedance and enables similar advantageous effects to be achieved.

Figure 9A:
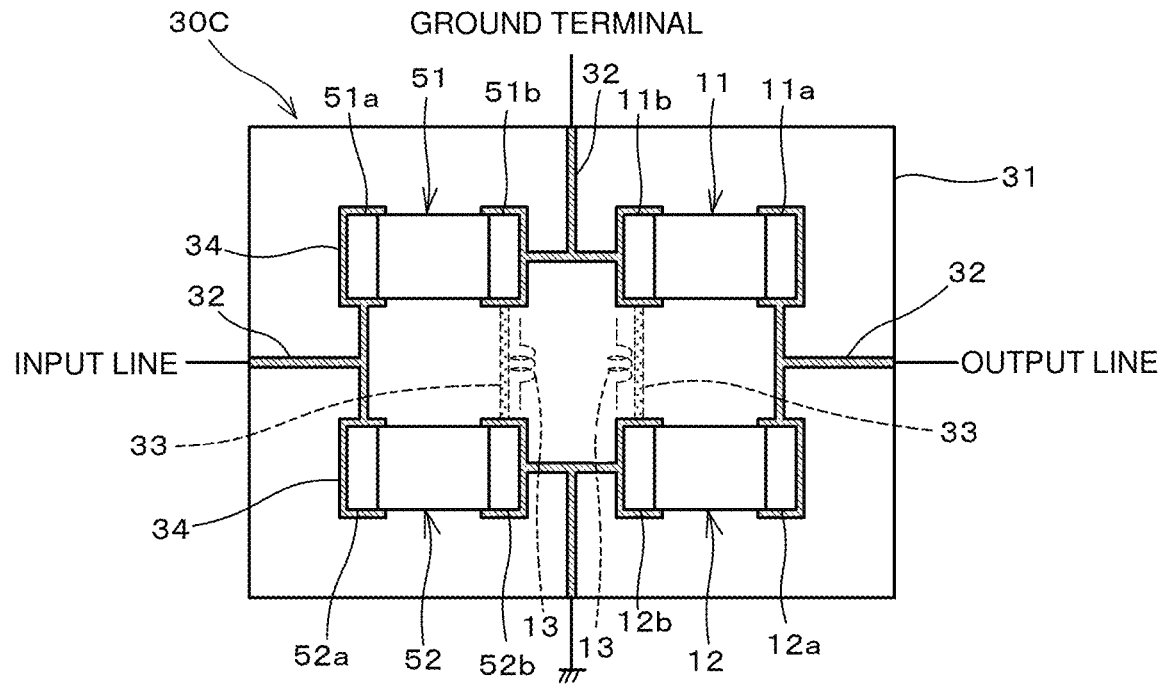
FIG. 9A is a plan view of a noise reduction element that embodies the noise reduction circuit according to the second preferred embodiment.
Figure 9B:
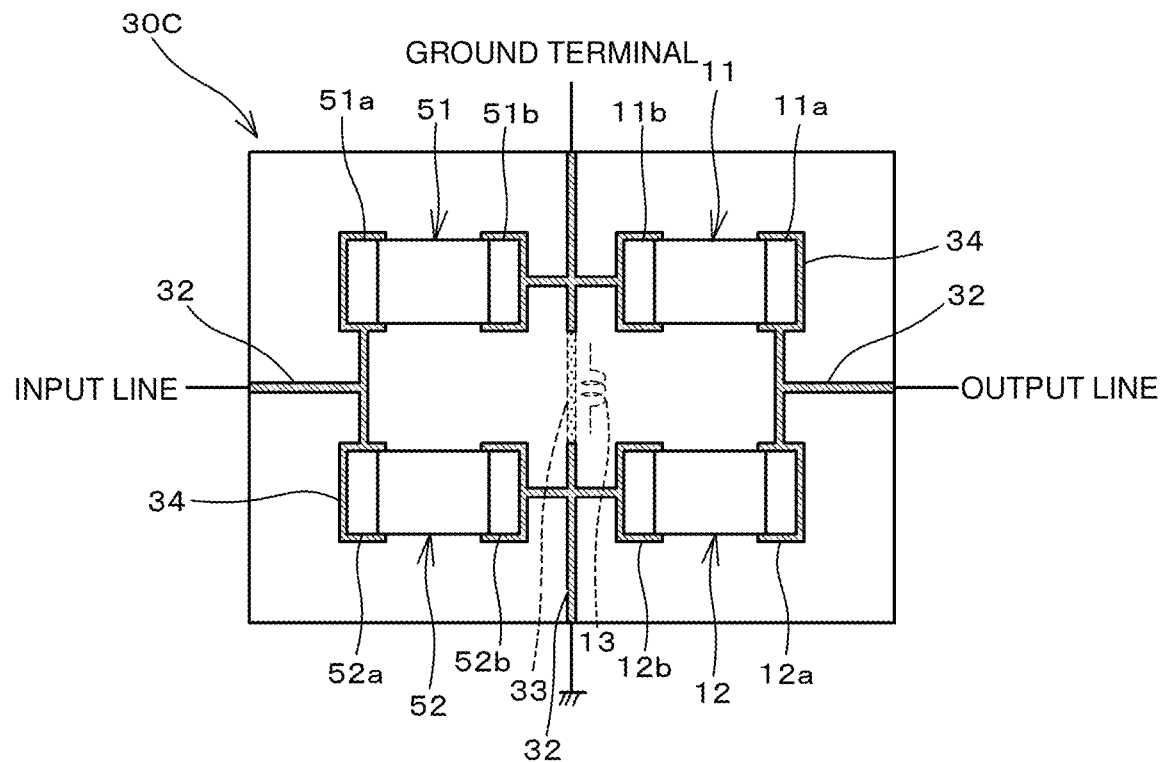
FIG. 9B is a plan view illustrating another example of a configuration of the noise reduction element according to the second preferred embodiment of the present invention.

FIG. 9A is a plan view of a noise reduction element 30C that embodies the noise reduction circuit according to the second preferred embodiment. FIG. 9B is a plan view illustrating another example of a configuration of the noise reduction element according to the second preferred embodiment. In FIGS. 9A and 9B, the same or similar component portions as those of the noise reduction element 30 illustrated in FIG. 4 are denoted by the same reference numerals, and will not be described in detail here.

As illustrated in FIG. 9A, the noise reduction element 30C is connected between the input line and the output line of the DC-DC converter, the ground, and the ground terminal of the switching control IC.

The noise reduction element 30C includes the first capacitor 11, the second capacitor 12, the third capacitor 51, and the fourth capacitor 52 mounted on the ferrite multilayer substrate 31, the internal wire 33 disposed inside the ferrite multilayer substrate 31 and defining and functioning as an inductor, and the surface wire 32 disposed on the surface of the ferrite multilayer substrate 31.

The outer electrode 11a disposed at one end of the first capacitor 11 is connected to the output line of the DC-DC converter, and the outer electrode 11b disposed at the other end of the first capacitor 11 is connected to the ground terminal of the switching control IC.

The outer electrode 12a disposed at one end of the second capacitor 12 is connected to the output line of the DC-DC converter, and the outer electrode 12b disposed at the other end of the second capacitor 12 is connected to the ground.

An outer electrode 51a disposed at one end of the third capacitor 51 is connected to the input line of the DC-DC converter, and an outer electrode 51b disposed at the other end of the third capacitor 51 is connected to the ground terminal of the switching control IC.

An outer electrode 52a disposed at one end of the fourth capacitor 52 is connected to the input line of the DC-DC converter, and an outer electrode 52b disposed at the other end of the fourth capacitor 52 is connected to the ground.

As in the case of the noise reduction element 30 illustrated in FIG. 4, the first capacitor 11 and the second capacitor 12 are connected by the internal wire 33 (see FIGS. 5A and 5B) interposed therebetween and defining and functioning as the inductor 13. Similarly, the third capacitor 51 and the fourth capacitor 52 are connected by the internal wire 33 interposed therebetween and defining and functioning as the inductor 13.

The internal wire 33 does not necessarily need to be provided both between the first capacitor 11 and the second capacitor 12 and between the third capacitor 51 and the fourth capacitor 52. That is, as illustrated in FIG. 9B, one internal wire 33 may be shared. Since this configuration requires only one inductor 13 defined by the internal wire 33, the size of the element is reduced, and the inductance value is able to be increased by increasing the winding radius of the internal wire 33.

The surface wire 32 makes connection between the ground terminal of the switching control IC and the first capacitor 11 and the third capacitor 51, between the output line of the DC-DC converter and the first capacitor 11 and the second capacitor 12, between the ground and the second capacitor 12 and the fourth capacitor 52, and between the input line of the DC-DC converter and the third capacitor 51 and the fourth capacitor 52. By making these connections using the surface wire 32, unintended formation of an inductor is prevented.

Figure 10:
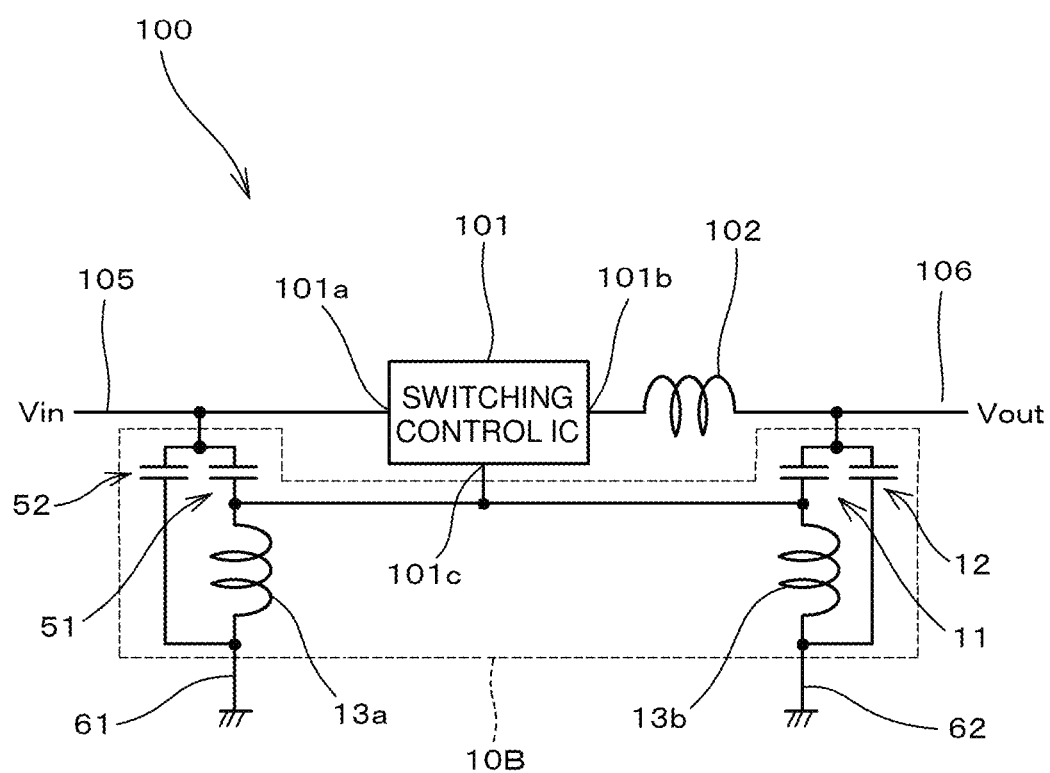
FIG. 10 is a diagram illustrating a modification of the noise reduction circuit according to the second preferred embodiment of the present invention.

FIG. 10 is a diagram illustrating a modification of the noise reduction circuit according to the second preferred embodiment. The same or similar portions as those of the noise reduction circuit illustrated in FIG. 8 are denoted by the same reference numerals, and will not be described in detail here.

A noise reduction circuit 10B illustrated in FIG. 10 includes an input-side inductor 13a and an output-side inductor 13b, instead of the inductor (first inductor) 13 illustrated in FIG. 8. The input-side inductor 13a and the output-side inductor 13b define a first inductor.

The input-side inductor 13a is disposed between the third capacitor 51 and the fourth capacitor 52. One end of the input-side inductor 13a connected to the fourth capacitor 52 is connected to the ground, with an input-side ground line 61 interposed therebetween.

The output-side inductor 13b is disposed between the first capacitor 11 and the second capacitor 12. One end of the output-side inductor 13b connected to the second capacitor 12 is connected to the ground, with an output-side ground line 62 interposed therebetween.

As described above, the input-side inductor 13a is connected to the ground, with the input-side ground line 61 interposed therebetween, and the output-side inductor 13b is connected to the ground, with the output-side ground line 62 interposed therebetween. This configuration reduces transmission of noise between the input side and the output side, and thus effectively reduces noise.

Figure 11:
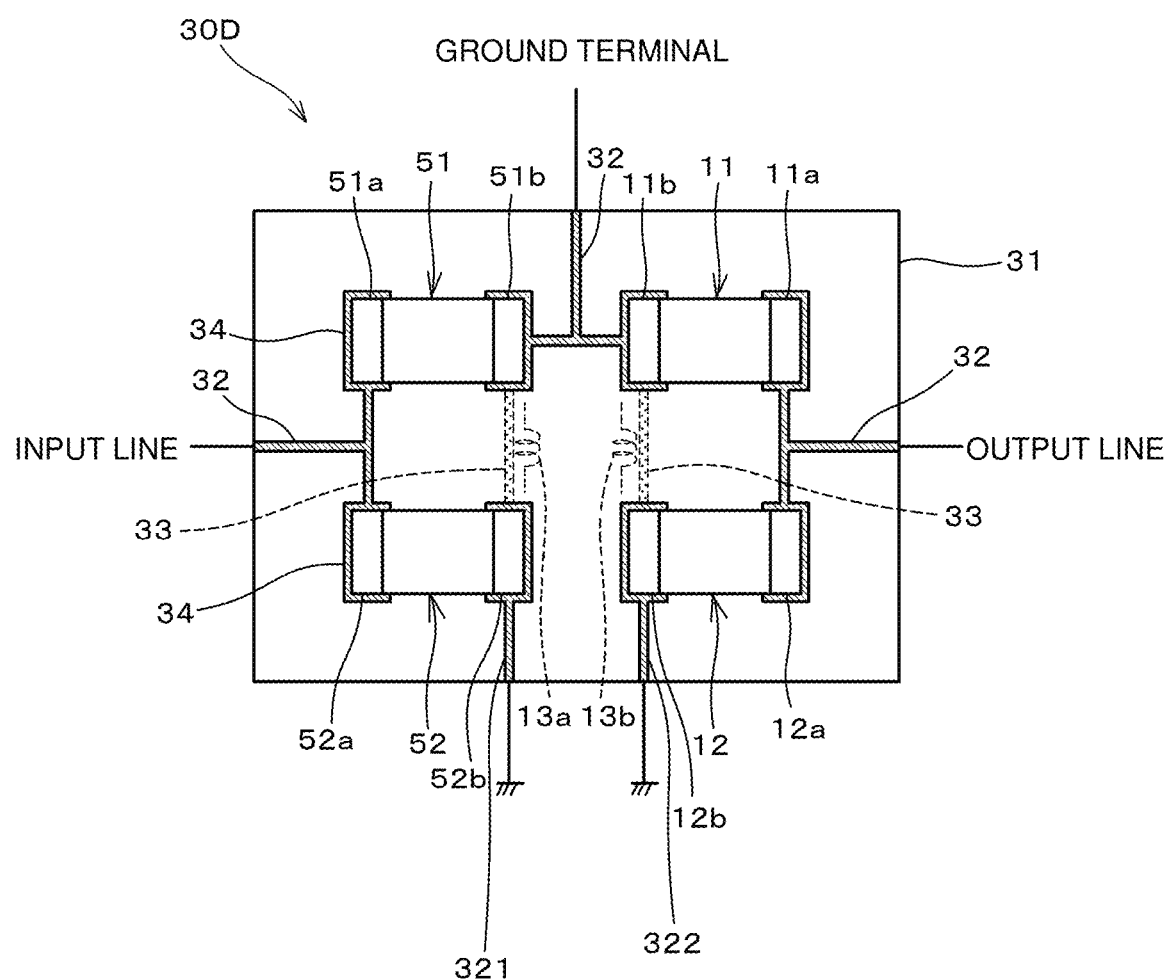
FIG. 11 is a plan view of a noise reduction element that embodies the noise reduction circuit according to the modification of the second preferred embodiment of the present invention illustrated in FIG. 10.

FIG. 11 is a plan view of a noise reduction element 30D that embodies the noise reduction circuit according to the modification of the second preferred embodiment illustrated in FIG. 10. In FIG. 11, the same or similar component portions as those of the noise reduction element 30C illustrated in FIG. 9A are denoted by the same reference numerals, and will not be described in detail here.

In the noise reduction element 30C illustrated in FIG. 9A, the outer electrode 12b of the second capacitor 12 and the outer electrode 52b of the fourth capacitor 52 are connected by the surface wire 32 therebetween, and the surface wire 32 is connected to the ground.

In the noise reduction element 30D illustrated in FIG. 11, however, the surface wire 32 includes an input-side ground surface wire 321 to connect the input-side inductor 13a to the ground, and an output-side ground surface wire 322 to connect the output-side inductor 13b to the ground. This allows the outer electrode 52b of the fourth capacitor 52 to be connected to the ground, with the input-side ground surface wire 321 interposed therebetween, and also allows the outer electrode 12b of the second capacitor 12 to be connected to the ground, with the output-side ground surface wire 322 interposed therebetween. The input-side ground surface wire 321 is a line corresponding to the input-side ground line 61 illustrated in FIG. 10, and the output-side ground surface wire 322 is a line corresponding to the output-side ground line 62 illustrated in FIG. 10.

The noise reduction element 30C illustrated in FIGS. 9A and 9B similarly includes the inductor 13 defined by the internal wire 33 that makes connection between the first capacitor 11 and the second capacitor 12, and the inductor 13 defined by the internal wire 33 that makes connection between the third capacitor and the fourth capacitor 52. However, since the second capacitor 12 and the fourth capacitor 52 are connected by the surface wire 32 therebetween, there is a possibility that noise will be transmitted between the input side and the output side.

In the noise reduction element 30D illustrated in FIG. 11, on the other hand, the input-side inductor 13a is connected to the ground, with the input-side ground surface wire 321 interposed therebetween, and the output-side inductor 13b is connected to the ground, with the output-side ground surface wire 322 interposed therebetween. That is, since the second capacitor 12 and the fourth capacitor 52 are not connected, transmission of noise between the input side and the output side is reduced.

Third Preferred Embodiment

Figure 12:
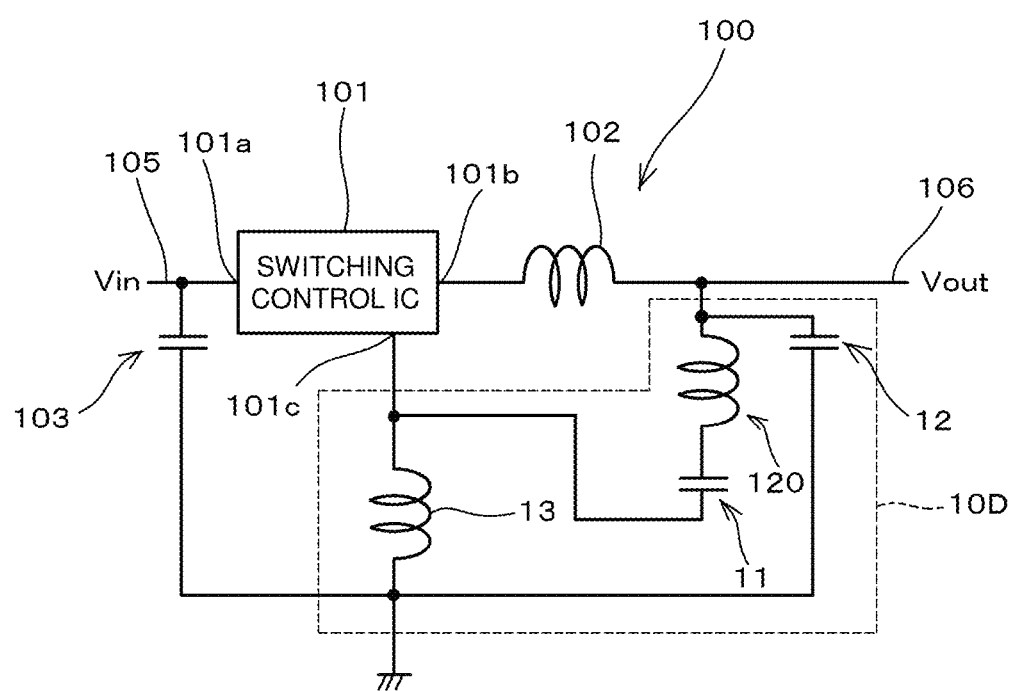
FIG. 12 is a diagram illustrating a noise reduction circuit according to a third preferred embodiment of the present invention.

FIG. 12 is a diagram illustrating a noise reduction circuit 10D according to a third preferred embodiment of the present invention. The same or similar portions as those of the noise reduction circuit 10 illustrated in FIG. 2 are denoted by the same reference numerals, and will not be described in detail here.

The noise reduction circuit 10D according to the third preferred embodiment differs from the noise reduction circuit 10 in FIG. 2 in that it further includes an inductor 120. For distinction between different inductors, the inductor 13 is referred to as a first inductor 13 and the inductor 120 is referred to as a second inductor 120.

The second inductor 120 is connected between the output line 106 and the first capacitor 11.

In the noise reduction circuit 10D according to the third preferred embodiment, as in the noise reduction circuit 10 according to the first preferred embodiment, a pulse current in a high frequency band flowing in the output line 106 is allowed to flow toward the second inductor 120, the first capacitor 11, and the first inductor 13 and is reduced, and noise in a low frequency band is passed through the second capacitor 12 and is reduced.

Also, a filter including the second inductor 120 and the first capacitor 11 connected in series effectively reduces spike noise flowing in the output line 106.

Figure 13:
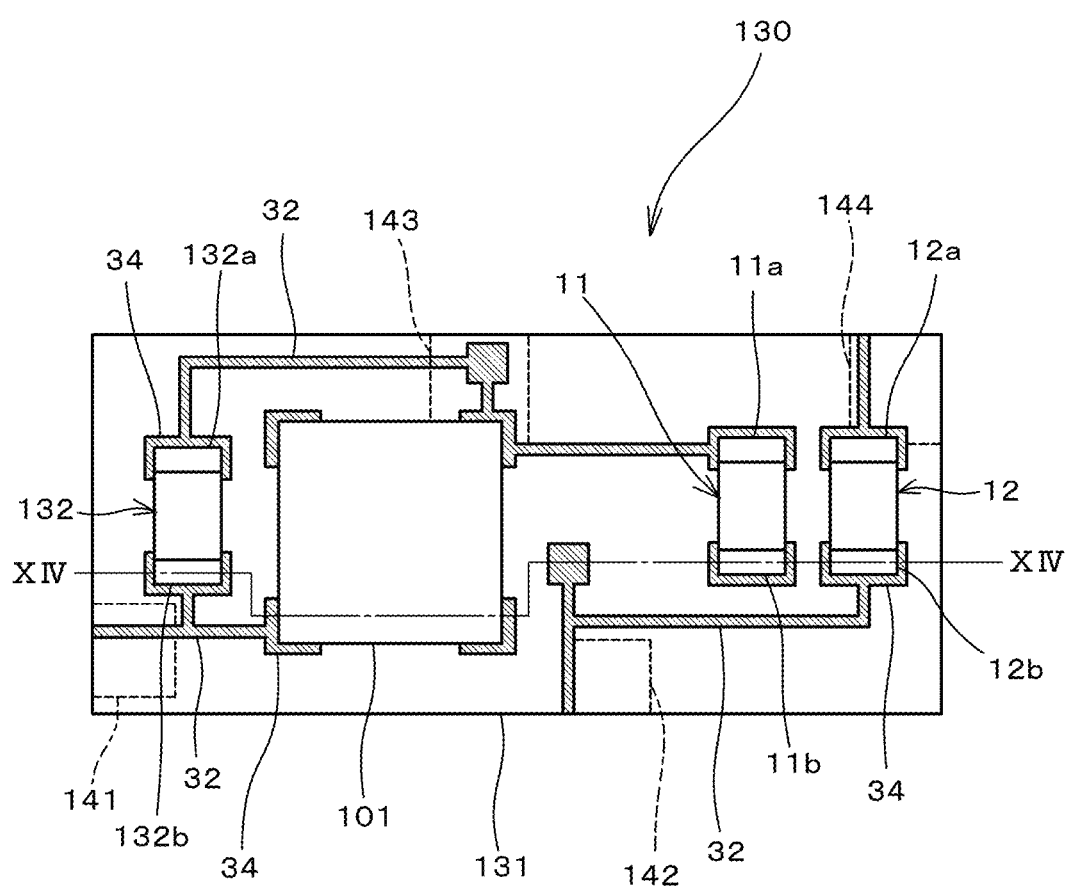
FIG. 13 is a plan view of a noise reduction element that embodies the circuit of the DC-DC converter including the noise reduction circuit according to the third preferred embodiment of the present invention.
Figure 14:
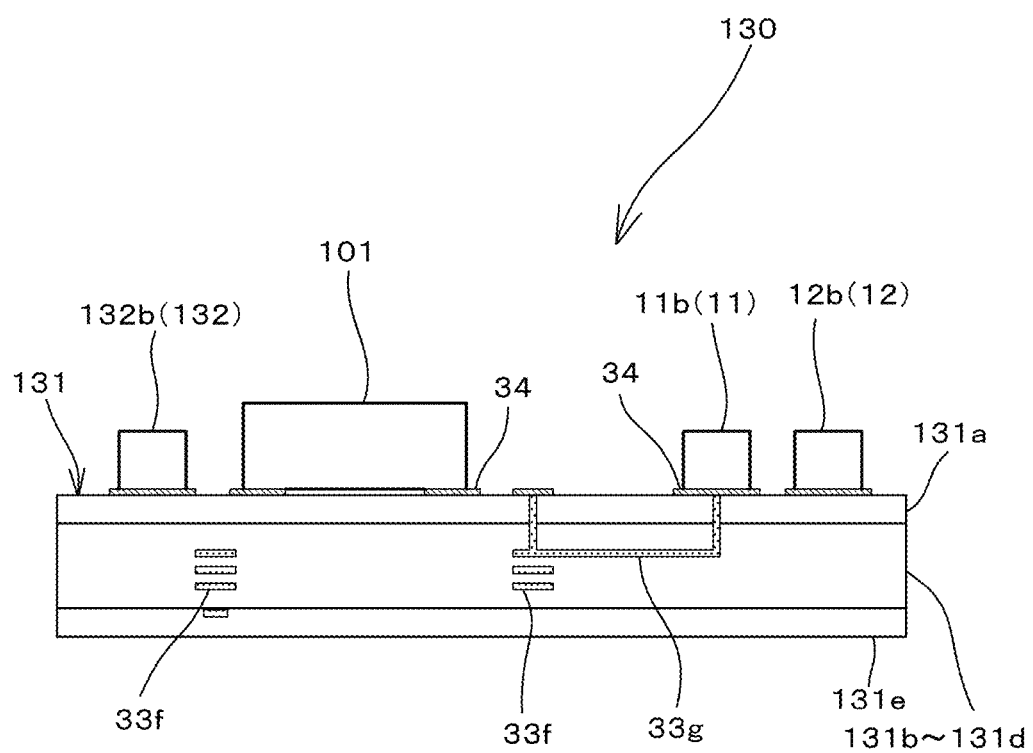
FIG. 14 is a cross-sectional view of the noise reduction element illustrated in FIG. 13 taken along line XIV-XIV.
Figure 15:
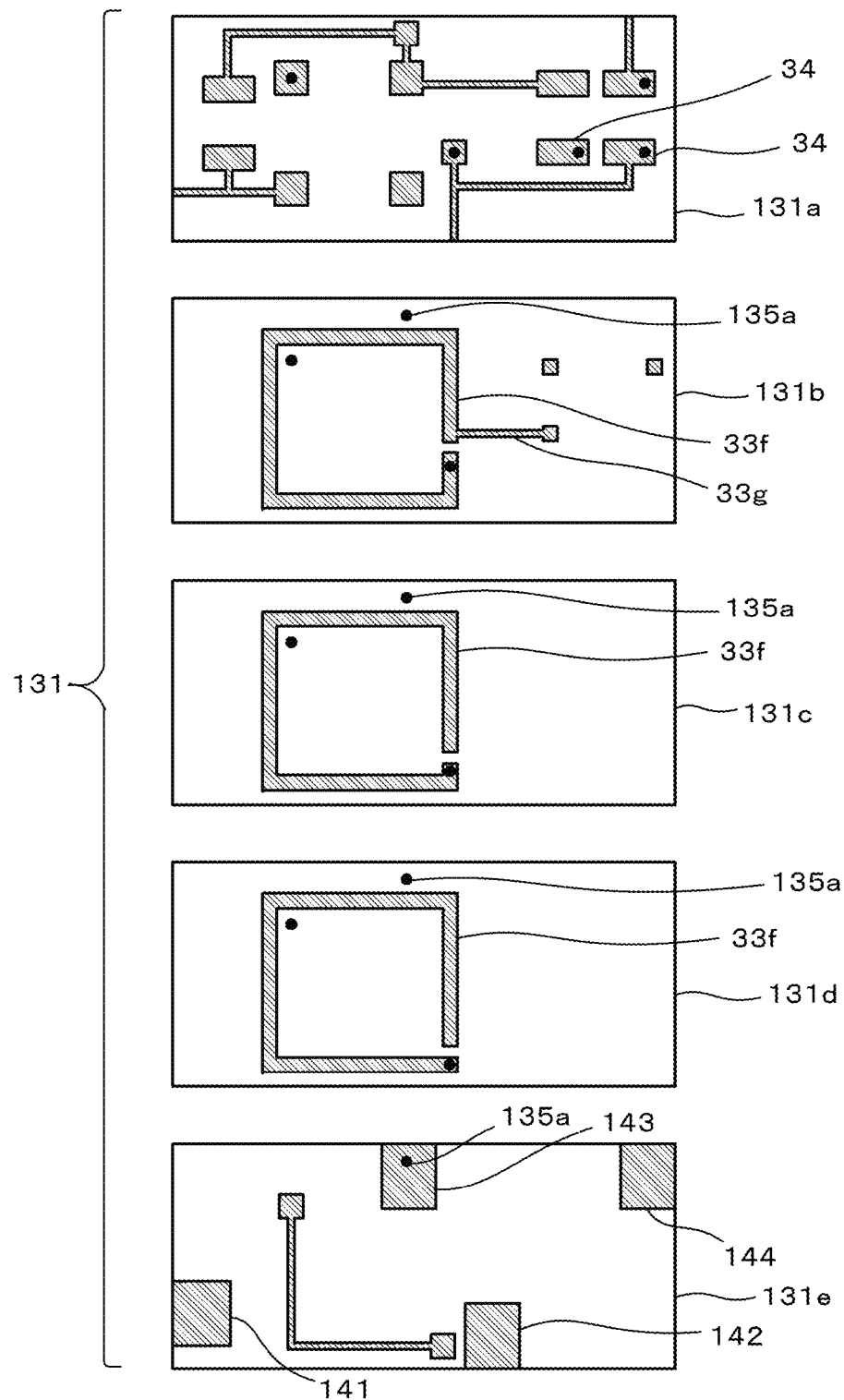
FIG. 15 is a plan view illustrating each layer of a ferrite multilayer substrate included in the noise reduction element.

FIG. 13 is a plan view of a noise reduction element 130 that embodies the circuit of the DC-DC converter including the noise reduction circuit 10D according to the third preferred embodiment. FIG. 14 is a cross-sectional view of the noise reduction element 130 illustrated in FIG. 13 taken along line XIV-XIV. FIG. 15 is a plan view illustrating each layer of a ferrite multilayer substrate 131 included in the noise reduction element 130.

The noise reduction element 130 includes the ferrite multilayer substrate 131, the first capacitor 11, the second capacitor 12, a third capacitor 132, the switching control IC 101, the surface wire 32 disposed on the surface of the ferrite multilayer substrate 131, the internal wire 33 (33f, 33g) disposed inside the ferrite multilayer substrate 131 and defining and functioning as an inductor, and the land electrodes 34 disposed on the surface of the ferrite multilayer substrate 131.

The first capacitor 11 is mounted such that the outer electrodes 11a and 11b defining a pair are positioned on the respective land electrodes 34. The second capacitor 12 is mounted such that the outer electrodes 12a and 12b defining a pair are positioned on the respective land electrodes 34.

The third capacitor 132 is mounted such that outer electrodes 132a and 132b defining a pair are positioned on the respective land electrodes 34. The third capacitor 132 corresponds to the input-side capacitor 103 illustrated in FIG. 1.

As illustrated in FIGS. 14 and 15, the ferrite multilayer substrate 131 has a structure in which a first non-magnetic layer 131a, a first magnetic layer 131b, a second magnetic layer 131c, a third magnetic layer 131d, and a second non-magnetic layer 131e are stacked in order. That is, these layers 131a to 131e are disposed such that the first magnetic layer 131b, the second magnetic layer 131c, and the third magnetic layer 131d having a higher magnetic permeability than the first non-magnetic layer 131a and the second non-magnetic layer 131e are sandwiched between the non-magnetic layers 131a and 131e. This reduces leakage of a magnetic flux to the outside.

Note that FIG. 15 shows the first non-magnetic layer 131a, the first magnetic layer 131b, the second magnetic layer 131c, and the third magnetic layer 131d as viewed from above in the stacking direction, and shows the second non-magnetic layer 131e as viewed from below in the stacking direction.

An input electrode 141, an output electrode 142, and two ground electrodes 143 and 144 are disposed on the second non-magnetic layer 131e.

The input electrode 141 is connected by the surface wire 32 to the input terminal of the switching control IC 101. The surface wire 32 that connects the input electrode 141 to the input terminal of the switching control IC 101 is provided not only on the first non-magnetic layer 131a, but also on the side surface of the ferrite multilayer substrate 131. By connecting the input electrode 141 to the input terminal of the switching control IC 101 using the surface wire 32 on the front and side surfaces of the ferrite multilayer substrate 131, not the wire inside the ferrite multilayer substrate 131, unintended formation of an inductor is prevented.

The output electrode 142 is connected by the surface wire 32 to the land electrode 34 (see FIG. 13) with the outer electrode 12b of the second capacitor 12 mounted thereon. The surface wire 32 that connects the output electrode 142 to the land electrode 34 with the outer electrode 12b of the second capacitor 12 mounted thereon is provided not only on the first non-magnetic layer 131a, but also on the side surface of the ferrite multilayer substrate 131. By connecting the output electrode 142 to the outer electrode of the second capacitor 12 using the surface wire 32 on the front and side surfaces of the ferrite multilayer substrate 131, not the wire inside the ferrite multilayer substrate 131, unintended formation of an inductor is prevented.

The two ground electrodes 143 and 144 are connected to the ground.

The internal wires 33f individually provided on the first magnetic layer 131b, the second magnetic layer 131c, and the third magnetic layer 131d are connected by a via hole conductor 135a to define the main inductor 102.

The internal wire 33g disposed on the first magnetic layer 131b defines the second inductor 120. The internal wire 33g is connected at one end thereof to the internal wire 33f on the first magnetic layer 131b, and connected at the other end thereof by the via hole conductor 135a to the land electrode 34 with the outer electrode 11b of the first capacitor 11 thereon.

The first inductor 13 illustrated in FIG. 12 is defined by the via hole conductor 135a illustrated in FIG. 15. The first inductor 13 defined by the via hole conductor 135a is connected at one end thereof to the ground terminal of the switching control IC 101, and connected at the other end thereof to the ground electrode 143.

The switching control IC 101, the main inductor 102, and the third capacitor 132 of the noise reduction element 130 described above may be disposed outside the ferrite multilayer substrate 131.

Figure 16A:
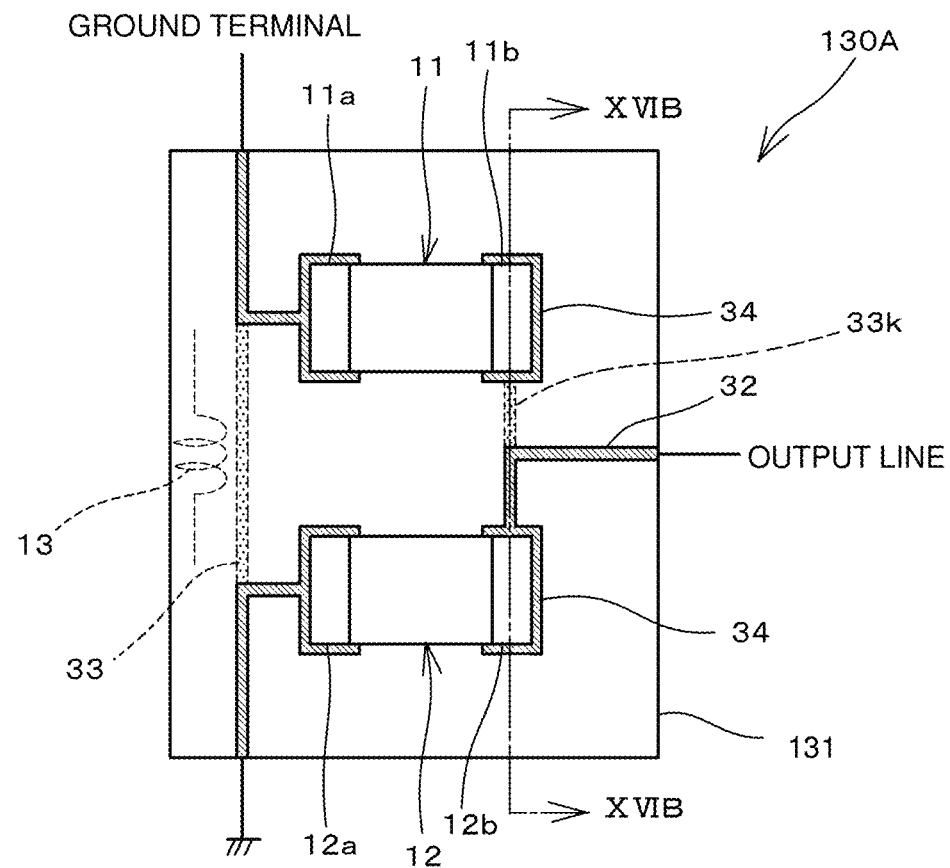
FIG. 16A is a diagram illustrating another example of a configuration of the noise reduction element according to the third preferred embodiment of the present invention.
Figure 16B:
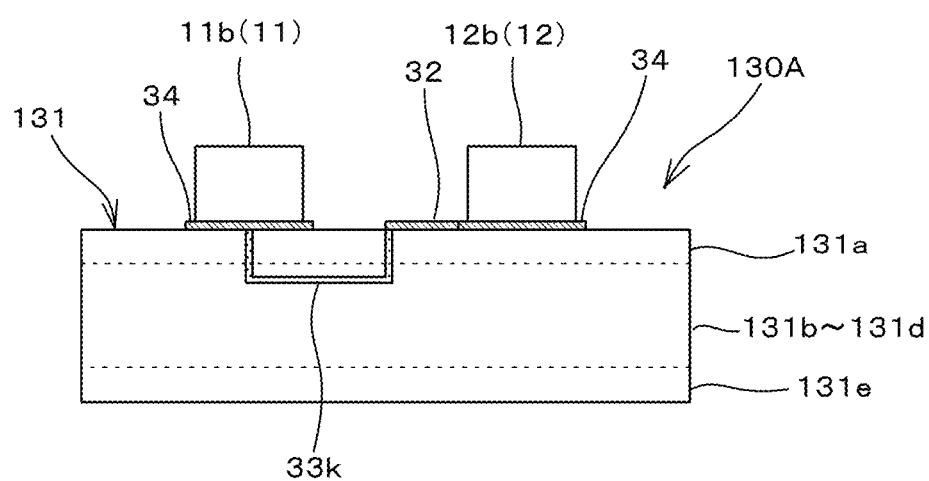
FIG. 16B is a cross-sectional view of the noise reduction element illustrated in FIG. 16A taken along line XVIB-XVIB.

FIG. 16A is a plan view of a noise reduction element 130A configured such that the switching control IC 101, the main inductor 102, and the third capacitor 132 are disposed outside the ferrite multilayer substrate 131. FIG. 16B is a cross-sectional view of the noise reduction element 130A illustrated in FIG. 16A taken along line XVIB-XVIB.

The noise reduction element 130A illustrated in FIGS. 16A and 16B differs from the noise reduction element 30 illustrated in FIG. 4 in that the outer electrode 11b of the first capacitor 11 is connected to the output line of the DC-DC converter, with the internal wire 33k and the surface wire 32 interposed therebetween. The internal wire 33k defines the second inductor 120 illustrated in FIG. 12. This configuration also effectively reduces spike noise flowing in the output line. Since the flow of spike noise through the inductor 13 into the ground is reduced, it is possible to effectively reduce mixing of spike noise through the ground into the noise reduction element 130A.

The present invention is not limited to the preferred embodiments described above, and various applications and modifications may be made within the scope of the present invention.

For example, although the noise reduction circuit 10 of the first preferred embodiment has been described as being provided on the output side of the DC-DC converter, it may be provided on the input side.

Figure 17:
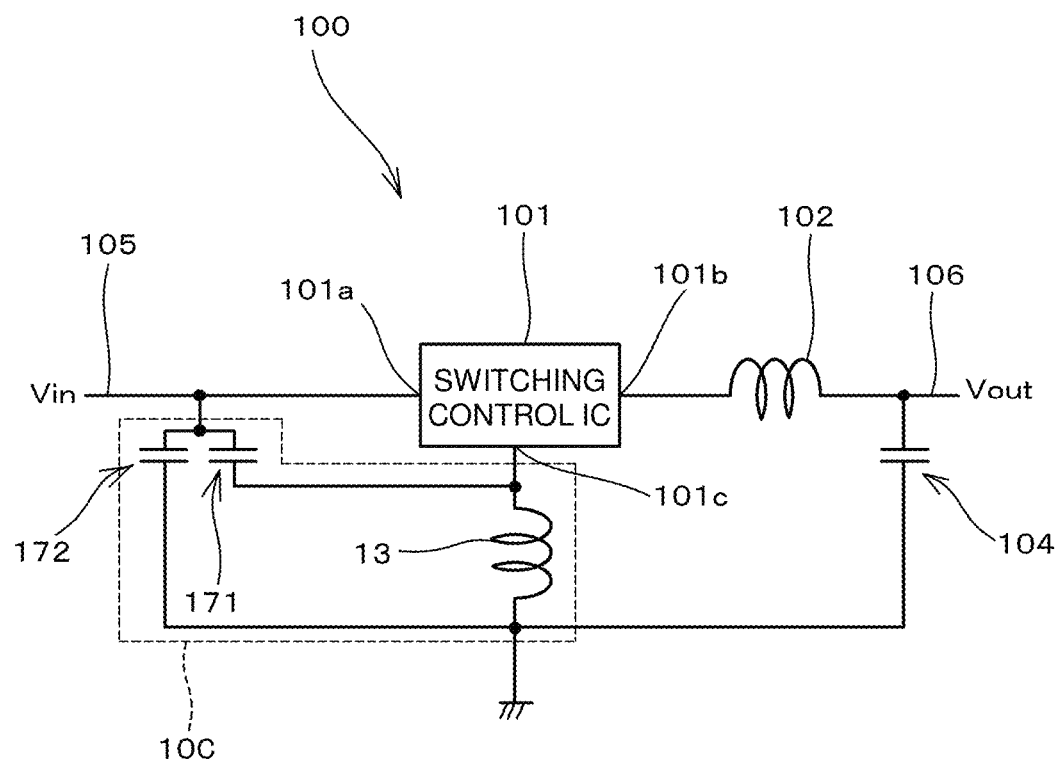
FIG. 17 is a diagram illustrating a configuration of a noise reduction circuit provided on the input side of the DC-DC converter.

FIG. 17 is a diagram illustrating a configuration of a noise reduction circuit 10C provided on the input side. In FIG. 17, the same or similar portions as those of the circuit of the DC-DC converter 100 illustrated in FIGS. 1 and 2 are denoted by the same reference numerals, and will not be described in detail here.

The noise reduction circuit 10C illustrated in FIG. 17 includes a first capacitor 171, a second capacitor 172, and the inductor 13.

The first capacitor 171 is connected between the input line 105 and the ground terminal 101c of the switching control IC 101.

The second capacitor 172 is connected between the input line 105 and the ground. The second capacitor 172 corresponds to the input-side capacitor 103 illustrated in FIG. 1.

The first capacitor 171 and the second capacitor 172 may be considered as corresponding to the input-side capacitor 103 illustrated in FIG. 1.

That is, the second capacitor 172 is, or both the first capacitor 171 and the second capacitor 172 are, also an input-side capacitor of the DC-DC converter 100.

The capacitance of the second capacitor 172 is preferably larger than the capacitance of the first capacitor 171. The capacitance of the second capacitor 172 may be equal or substantially equal to the capacitance of the first capacitor 171.

The inductor 13 is connected between the ground terminal 101c of the switching control IC 101 and the ground.

With the configuration described above, a pulse current in a high frequency band flowing in the input line 105 is allowed to flow toward the first capacitor 171 and the inductor 13 and is reduced. Noise in low frequency band passing along the input line 105 is passed through the second capacitor 172 and is reduced.

The noise reduction circuit 10A according to the second preferred embodiment illustrated in FIG. 8 includes the third capacitor 51 and the fourth capacitor 52, in addition to the components of the noise reduction circuit 10 according to the first preferred embodiment illustrated in FIG. 2. Similarly, the third capacitor 51 and the fourth capacitor 52 may be added to the components of the noise reduction circuit 10D according to the third preferred embodiment illustrated in FIG. 12. A noise reduction circuit 10E with this configuration is illustrated in FIG. 18.

Figure 18:
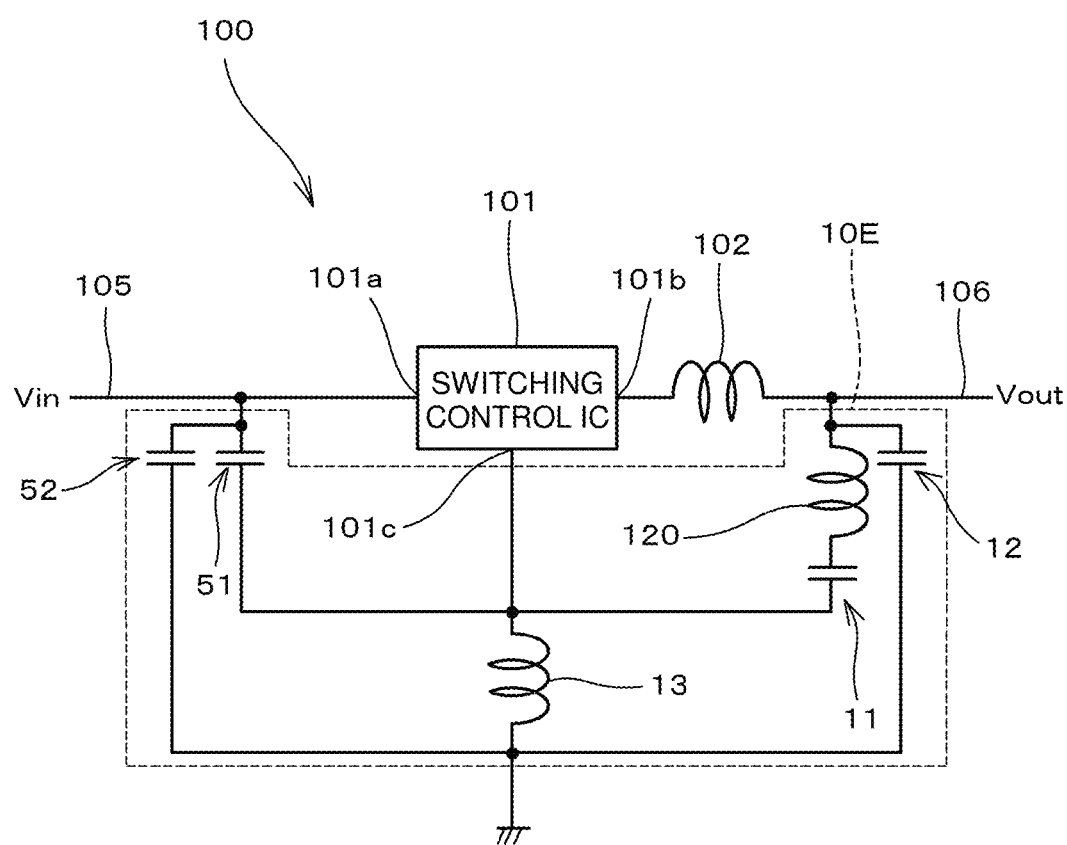
FIG. 18 is a diagram illustrating a noise reduction circuit configured by adding a third capacitor and a fourth capacitor to the noise reduction circuit according to the third preferred embodiment of the present invention.

Although not shown, a noise reduction element that embodies the noise reduction circuit 10E illustrated in FIG. 18 may be made.

A noise reduction circuit or a noise reduction element is preferably included in a step-down DC-DC converter in the examples described above, but may be included in a step-up DC-DC converter or in a step-up/step-down DC-DC converter, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A noise reduction circuit connected between at least one line of an input line and an output line of a DC-DC converter, a ground, and a ground terminal of a switching control IC included in the DC-DC converter, the noise reduction circuit comprising:
a first capacitor connected between the output line and the ground terminal;
a second capacitor connected between the output line and the ground;
a third capacitor connected between the input line and the ground terminal;
a fourth capacitor connected between the input line and the ground;
an input-side inductor connected between the ground terminal and the ground; and
an output-side inductor connected between the ground terminal and the ground;
wherein
the input-side inductor is connected to the ground, with an input-side ground line interposed therebetween, and the output-side inductor is connected to the ground, with an output-side ground line interposed therebetween.

2. The noise reduction circuit according to claim 1, wherein a capacitance of the second capacitor is larger than or equal to a capacitance of the first capacitor.

3. The noise reduction circuit according to claim 1, wherein a capacitance of the fourth capacitor is larger than or equal to a capacitance of the third capacitor.

4. The noise reduction circuit according to claim 1, further comprising a second inductor connected between the at least one line and the first capacitor.

5. The noise reduction circuit according to claim 4, further comprising a ferrite multilayer substrate on which the first and second capacitors are mounted.

6. The noise reduction circuit according to claim 5, wherein
the ferrite multilayer substrate includes non-magnetic layers and a magnetic layer having a higher magnetic permeability than the non-magnetic layers; and
the input-side inductor, the output-side inductor, and the second inductor are disposed on the magnetic layer.

7. The noise reduction circuit according to claim 6, wherein the non-magnetic layers sandwich the magnetic layer therebetween.

8. The noise reduction circuit according to claim 5, wherein each of the input-side inductor and the output-side inductor is defined by an internal wire inside the ferrite multilayer substrate.

9. The noise reduction circuit according to claim 4, further comprising:
a ferrite multilayer substrate on which the first and second capacitor are mounted; wherein
the second inductor is defined by an internal wire inside the ferrite multilayer substrate.

10. A noise reduction circuit connected between at least one line of an input line and an output line of a DC-DC converter, a ground, and a ground terminal of a switching control IC included in the DC-DC converter, the noise reduction circuit comprising:
a first capacitor connected between the output line and the ground terminal;
a second capacitor connected between the output line and the ground;
a third capacitor connected between the input line and the ground terminal;
a fourth capacitor connected between the input line and the ground;
an input-side inductor connected between the ground terminal and the ground; and
an output-side inductor connected between the ground terminal and the ground; wherein
the input-side inductor is connected to the ground, with an input-side ground line interposed therebetween, and the output-side inductor is connected to the ground, with an output-side ground line interposed therebetween; and
the first capacitor and the second capacitor are connected to a same node on the output line.

11. The noise reduction circuit according to claim 10, wherein a capacitance of the second capacitor is larger than or equal to a capacitance of the first capacitor.

12. The noise reduction circuit according to claim 10, wherein a capacitance of the fourth capacitor is larger than or equal to a capacitance of the third capacitor.

13. The noise reduction circuit according to claim 10, further comprising a second inductor connected between the at least one line and the first capacitor.

14. The noise reduction circuit according to claim 10, further comprising a ferrite multilayer substrate on which the first and second capacitors are mounted.

15. The noise reduction circuit according to claim 10, further comprising:
- a second inductor connected between the at least one line and the first capacitor; and
- a ferrite multilayer substrate on which the first and second capacitors are mounted; wherein
- the ferrite multilayer substrate includes non-magnetic layers and a magnetic layer having a higher magnetic permeability than the non-magnetic layers; and
- the input-side inductor, the output-side inductor, and the second inductor are disposed on the magnetic layer.

16. The noise reduction circuit according to claim 15, wherein the non-magnetic layers sandwich the magnetic layer therebetween.

\* \* \* \* \*